United States Patent [19]

Ward

[11] Patent Number: 5,111,064

[45] Date of Patent: May 5, 1992

[54] SLOW RAMP HIGH DRIVE OUTPUT PAD

[75] Inventor: James Ward, Gilbert, Ariz.

[73] Assignee: VLSI Technology, Inc., San Jose, Calif.

[21] Appl. No.: 577,980

[22] Filed: Sep. 5, 1990

[51] Int. Cl.[5] .......................................... H03K 17/60
[52] U.S. Cl. ................... 307/270; 307/585; 307/572; 307/601
[58] Field of Search ............ 307/443, 451, 542, 542.1, 307/572, 585, 270, 594, 597, 601, 263

[56] References Cited

U.S. PATENT DOCUMENTS

| | | | |
|---|---|---|---|
| 4,789,796 | 12/1988 | Foss | 307/443 |
| 4,820,942 | 4/1989 | Chan | 307/443 |
| 4,918,339 | 4/1990 | Shigeo et al. | 307/443 |
| 4,928,023 | 5/1990 | Marshall | 307/443 |
| 4,961,010 | 10/1990 | Davis | 307/542 |

Primary Examiner—Stanley D. Miller
Assistant Examiner—Sinh Tran
Attorney, Agent, or Firm—LaValle D. Ptak

[57] ABSTRACT

A CMOS drive circuit an integrated circuit bonding pad is controlled by a pre-driver signals to change the potential on the output pad in accordance with these signals. Undesirable interference (emi) problems are eliminated or significantly reduced by slowing the ramp of change of the signal appearing on the output bonding pad when it changes from a high or positive binary state to a lower, relatively negative binary state. This is effected by splitting the output NMOS transistor of the CMOS output driver into two parallel connected, relatively small-sized transistor. Each of these transistors is driven from the signal input terminal through a relatively low current source which causes the gate capacitance to be slowly charged.

4 Claims, 1 Drawing Sheet

SLOW RAMP HIGH DRIVE OUTPUT PAD

BACKGROUND

CMOS integrated circuitry is widely used in modern electronic applications. Such circuitry has been a significant factor in the low cost construction of highly sophisticated systems, and particularly is of significance in popular personal computer systems currently in widespread use. These systems, and many other electronic systems used in a variety of applications, employ binary digital signals to effect the various operations in the systems. Because of the high speeds employed in such binary digital signals, the fast rise and fall times of the signals can cause interference with the operations of other portions of a circuit within a machine or system. Radiation of undesirable signal spikes outside of a system also may cause interference with other electronic apparatus operating nearby.

In the past, the solutions for eliminating the effects of electro-magnetic interference radiation (emi) ranged from shielding circuit areas which were subject to generating such interference to the use of ferrite beads on circuit leads, where such signals appeared, to round the edges of the signals; so that the unwanted spikes did not occur. These solutions require additional physical apparatus to accomplish them. As a result, additional bulk is built into any system which requires such shielding or ferrite beads; and additional manufacturing complexities are created.

A specific circuit area for personal computers which has emi problems is the keyboard clock lines, due to the fast fall times of the clock signals. Due to the slow speed requirements on the keyboard to system interface, it is not necessary to have fast fall times. The typical CMOS bonding pad drive circuit, however, which has been used in the past, is configured to rapidly switch the respective P-channel and N-channel transistors on and off quickly in response to input signals, thereby transferring fast rise and fast fall times to the output bonding pad driven by such a circuit.

It is desirable to eliminate or minimize emi problems on a CMOS circuit output pad while providing high current drive capability without requiring external shielding or ferrite beads to accomplish the desired result.

SUMMARY OF THE INVENTION

It is an object of this invention to provide an improved CMOS drive circuit.

It is another object of this invention to provide an improved slow ramp, high current drive CMOS circuit.

It is a further object of this invention to provide a CMOS drive circuit for an output pad in which the fall time of the signal applied to the pad is provided with a relatively slow ramp.

In accordance with a preferred embodiment of this invention, an output pad connected to a CMOS drive circuit is provided with a relatively slow ramp when the NMOS transistor portion of the drive circuit is rendered conductive. This is accomplished by splitting the NMOS transistor into two parallel-connected transistors of relatively small geometry. These transistors are then driven by a relatively low current source to cause the gate capacitor to charge at a relatively slow rate. One of the NMOS output transistors is driven with a signal which is delayed from that which drives the other; so that the rate at which these transistors are turned on is somewhat staggered. The result is a relatively slow ramp in the signal change appearing on the output bonding pad resulting from the controlled rate of turn-on of the split parallel-connected NMOS transistor portion of the CMOS output drive circuit.

DETAILED DESCRIPTION

Figure 1:
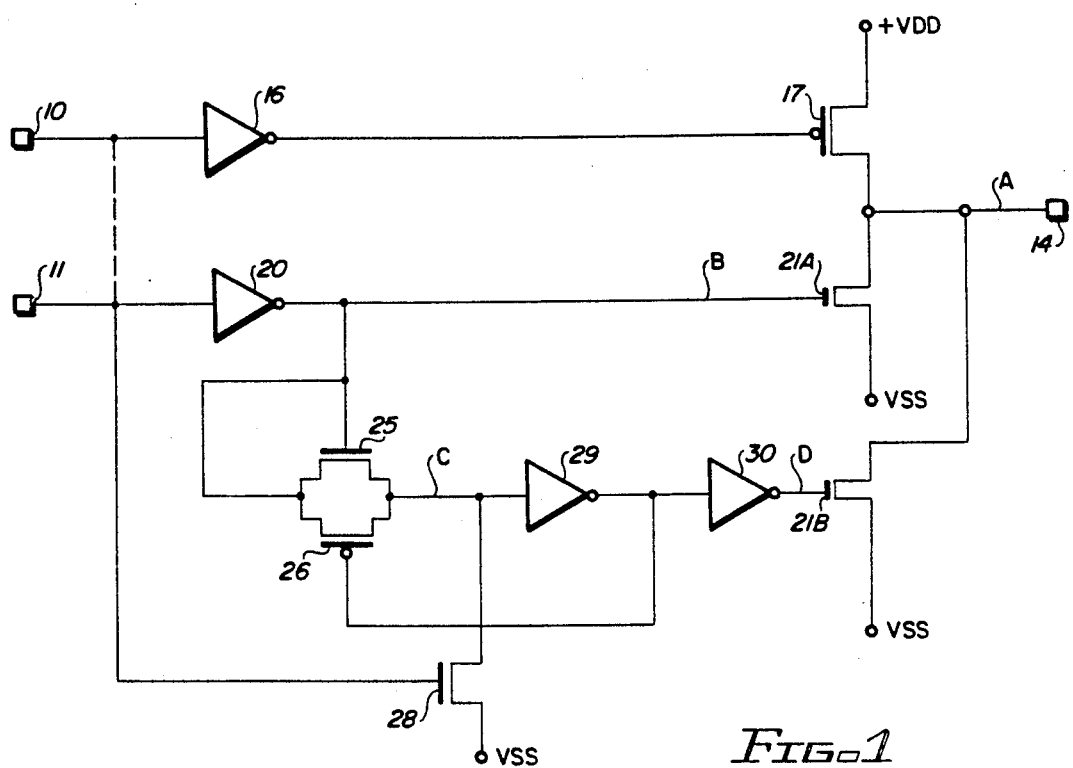
FIG. 1 is a circuit diagram of a preferred embodiment of the invention.

Reference now should be made to the drawings which disclose a preferred embodiment of the invention. The system which is shown in FIG. 1 comprises a CMOS output driver supplying output signals on an output bonding pad 14, which are the result of gate signals applied to a pair of input gate terminals 10 and 11. CMOS circuits for producing bistable or tri-state signals on an output bonding pad 14, as a reflection of signals applied to terminals, such as the terminals 10 and 11, are widely used. Typically, the bonding pad is connected to the interconnected junction between a PMOS transistor and an NMOS transistor, the source-drain paths of which in turn are connected between a source of relatively positive voltage VDD and a source of relatively negative voltage VSS. For bistable applications, the input terminals 10 and 11 of a typical CMOS drive circuit are interconnected; so that the output signals appearing on the output bonding pad 14 are bistable circuits. A tri-state operation, however, can be obtained if these input terminals 10 and 11 are not interconnected. The operation of the circuit, however, is the same so far as the drive portion is concerned.

For the purpose of the following discussion, assume the output signals appearing on the bonding pad 14 are normal binary signals. In such a situation, the input terminals 10 and 11 are shorted together or interconnected together (shown by dotted lines in FIG. 1), and a common input signal is applied to them. The system will be described with this type of interconnection.

Figure 2:
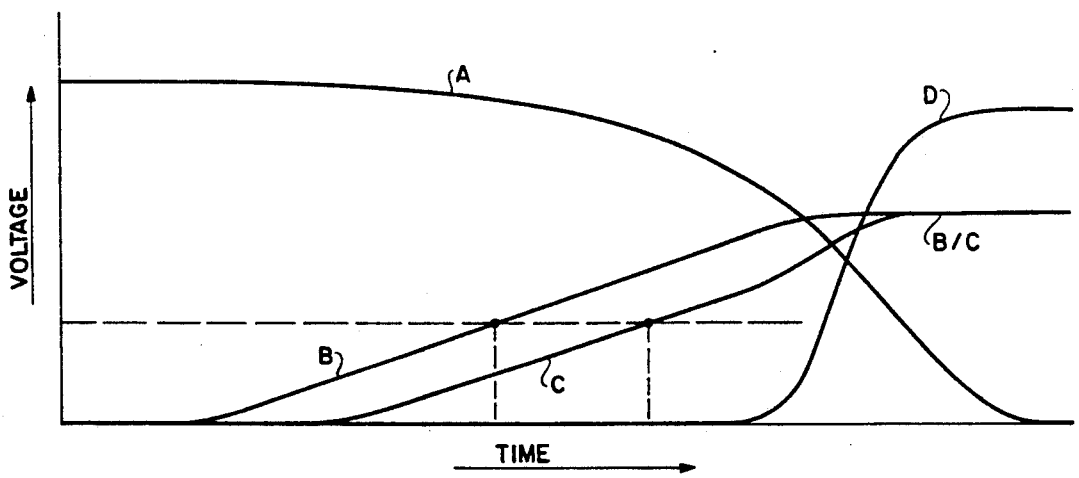
FIG. 2 shows waveforms of signals appearing at various points marked on FIG. 1 to aid in an understanding of the operation of the circuit of FIG. 1.

In the system shown in FIG. 1, the rise time of a positive going binary "one" appearing on the input terminal 10/11 is desired to be fast or sharp. When this occurs, the signal is passed through a buffer invertor 16 to the gate of a PMOS transistor 17 of a CMOS output driver stage to rapidly turn on the transistor 17. This causes the output signal "A" appearing on the output bonding pad 14 to be rapidly switched to a high or positive potential. In the following discussion, the system is considered to start with this condition of operation. The PMOS transistor 17 is conductive, and the output signal "A" on the bonding pad 14 is high, as shown on the left hand side of the waveform A of FIG. 2. When the input signal switches from a binary "1" or a high signal to a binary "0" or a low signal, the transistor 17 is rapidly turned off in a normal manner.

In a normal CMOS output circuit, a single NMOS transistor is connected in series with the transistor 17 and is rendered conductive when the transistor 17 is rendered non-conductive and vice-versa. The transition times are typically very sharp, closely approximating an ideal square wave. In the circuit shown in FIG. 1, however, the NMOS portion of the CMOS output stage consists of a pair of NMOS transistors 21A and 21B, having their source-drain paths connected in parallel with one another between the bonding pad 14 and the voltage source VSS. In addition, the two transistors 21A and 21B each are approximately one-half the size of a normal complimentary NMOS transistor used in such a driver circuit. This is indicated in FIG. 1 by physically illustrating the transistors 21A and 21B as being smaller in size than the PMOS transistor 17.

The gate of the NMOS transistor 21A is driven by the output of an invertor buffer amplifier 20, which is connected to receive the input signals on the input terminal 10/11 in common with, or in parallel with, the input signals applied to the buffer invertor amplifier 16. The invertor amplifier 20, however, is physically sized to function as a relatively low current, constant current source for driving the gate of the transistor 21A. This is accomplished in the CMOS buffer amplifier 20, simply by making the size of the transistors used in the buffer amplifier smaller than those used in the amplifier 16. As in the case of the NMOS transistors 21A and 21B, this is indicated in FIG. 1 by illustrating the physical size of the invertor amplifier 20 as smaller than the physical size of the invertor amplifier 16.

Since there is a relatively high capacitance on the gate of the NMOS transistor 21A, the relatively small constant current which is applied to the gate of the transistor 21A from the inverter 20 causes a slow ramp or charging of the gate capacitance, with a slow turn-on of the transistor 21A. This ramp or charge is shown in waveform "B" of FIG. 2, and is labeled in FIG. 1 as appearing on the gate of the transistor 21A. This causes a very gradual drop in the potential of the output signal on the bonding pad 14, as is illustrated in the slow drop of waveform "A" in FIG. 2. The time of the change of the potential of the input signal on the input terminals 10/11 from a binary 1 to a binary 0 occurs at the left-hand edge or the beginning of the upward ramp of waveform "B" in FIG. 2. This is the first step in slowing the fall time of the output signal appearing on the bonding pad 14.

The second step of the control of the fall time of the signal on the bonding pad 14 is accomplished by means of the parallel connected second NMOS output transistor 21B, a pair of cascaded invertor buffer amplifiers 29 and 30, and a CMOS transmission gate consisting of an N-channel transistor 25 and a P-channel transistor 26, along with an additional control N-channel transistor 28.

At the time the input signal on the terminals 10/11 switches from a binary 1 to binary 0 or a low signal, the output of the buffer invertor 20 is coupled to the gate of the NMOS transistor 25 of the transmission gate. At this time, however, only the NMOS transistor 25 is rendered conductive. The transistor 25 is configured as a source follower, as is apparent from FIG. 1, so that its output, waveform "C," is delayed in time, but tracks or follows the signal "B" applied to the gate of the NMOS output transistor 21A. This is apparent in FIG. 2 where it can be seen that waveforms "B" and "C" track one another, but that waveform "C" is delayed in time from waveform "B". Waveform "C" reaches a voltage level previously reached by waveform "B" at some predetermined later time, as indicated by the dotted lines in FIG. 2.

After the potential of the signal "C," as applied from the output of the NMOS transistor 25, reaches the switch-on point of the invertor buffer 29, the output of the buffer 29 is applied to the gate of the PMOS transistor 26 of the transmission gate to turn that transistor on. This permits the full potential of the output signal on the output of the buffer invertor 20 (signal "B") to be passed completely through to the input of the buffer amplifier 21 instead of this signal minus the threshold of the source follower transistor 25. When this occurs, the buffer invertor 29 is removed from remaining in its transition region where it would be drawing current.

Cascaded to the output of the buffer invertor 29 is a second buffer invertor 30 which is constructed with a small P-channel similar to the small P-channel construction of the buffer invertor 20. For that reason, the buffer invertor 30 is also shown physically smaller in FIG. 1 than the buffer invertor amplifier 29. The output of the buffer invertor 30 functions as a constant current source to drive the gate of the second NMOS output transistor 21B to charge the capacitance of that gate in a manner similar to the operation of the transistor 21A described above. The full effect of this is illustrated in waveform "D" of FIG. 2, which shows the manner in which the output transistor 21B is supplied with gate signals to cause it to be rendered conductive.

The result of the parallel-connected or split NMOS transistor in the CMOS output drive circuit, and the current source and delayed current source drives for the gates of the NMOS transistors 21A and 21B is to cause the output signal "A" on the pad 14 to be controlled essentially by the transistor 21A until it reaches approximately the fifty percent point of its new or lower value, resulting from the change of the input signal from a binary 1 to a binary 0. At the time this fifty percent point is reached, the second NMOS output transistor 21B is turned on relatively rapidly, as illustrated by waveform "D" to pull the signal on the output bonding pad 14 down to a low level (near VSS) where it remains until the next input signal change on the terminals 10 and 11.

When the input signal changes back from a binary low or 0 to a binary high or 1, the NMOS transistor 28 is used to effect the switching off of the transistor 21B. When this occurs, the signal on the output of the buffer invertor 20 is a normal level, but the signal "C" at the output of the transmission gate 25/26 is prevented from going to such a normal level, since the gate of the NMOS transistor 25 is at or near ground, turning the transistor 25 off. In this situation, the transistor 28 is turned on, pulling the input to the buffer invertor amplifier 29 low, permitting the output of the buffer invertor amplifier 30 to go low to turn off the NMOS output transistor 21B. This essentially constitutes the reset mode of operation of the circuit. In this situation, both the transistors 21A and 21B are off or non-conductive; and the PMOS transistor 17 is fully conductive to provide the desired output signal on the output terminal 14.

The cycle of operation described above is repeated as the input signal on the terminal 10/11 changes from positive to negative and back again, each time causing the negative-going or falling ramp of the signal on the bonding pad 14 to have a gradual fall, rather than a sharp fall time. Thus, undesirable signal spikes, which might result in interference of operation of other parts of the circuit, are eliminated.

The foregoing description of the preferred embodiment of the invention is to be considered illustrative of the invention and not as limiting. Various changes and modifications will occur to those skilled in the art without departing from the true scope of the invention as defined in the appended claims.

I claim:

1. A drive circuit for a CMOS output pad including in combination:

an output bonding pad;

a PMOS output transistor having a gate and having the drain-source path thereof connected between a relatively positive supply voltage VDD and said output bonding pad;

an NMOS output transistor means comprising first and second NMOS output transistors of approximately equal size, such that the physical geometry of each said first and second NMOS output transistors is substantially one-half that of a conventional NMOS transistor, said second NMOS output transistor having a high gate capacitance, and each of said first and second output transistors having a gate and having the drain source path thereof connected between said output bonding pad and a source of relatively negative supply potential VSS;

first supply means for supplying binary input drive signals to the gate of said PMOS output transistor;

display means;

second supply means providing a relatively low current for supplying said binary input drive signals to the gate of said first NMOS output transistor, said second supply means functioning as a current source to delay the turn-on of said first NMOS output transistor from a non-conductive condition to a fully conductive condition for a pre-determined time wherein said second supply means is connected to the gate of said second output NMOS transistor through said delay means for supplying said relatively low current thereto, causing delayed conductivity of said second NMOS output transistor from its non-conductive state to its fully conductive state, such that a relatively slow time ramp occurs to change the output voltage on said output bonding pad from a relatively high binary value to a relatively low binary value in response to corresponding changes of said binary input drive signals.

2. The combination according to claim 1 wherein said second supply means comprises a substantially constant current source and at least said first NMOS output transistor is constructed with a relatively high gate capacitance which is charged by the constant current from said second means.

3. A drive circuit for a CMOS output pad including in combination:

an output bonding pad;

a PMOS output transistor having a gate and having the drain-source path thereof connected between a relatively positive supply voltage VDD and said output bonding pad;

an NMOS output transistor means comprising first and second NMOS output transistors of approximately equal size, such that the physical geometry of each said first and second NMOS output transistors is substantially one-half that of a conventional NMOS transistor, said first NMOS output transistor having a relatively high gate capacitance, and each of said first and second output transistors having a gate and having the drain source path thereof connected between said output bonding pad and source of relatively negative supply potential VSS;

first supply means for supplying binary input drive signals to the gate of said PMOS output transistor;

second supply means comprising a substantially constant current source for supplying said binary input drive signals to the gates of said first and second NMOS output transistors, said second supply means functioning as a current source to render said first NMOS output transistor conductive relatively slowly compared to the rate of change of conductivity of said PMOS output transistor, such that a relatively slow time ramp occurs to change the output voltage on said output bonding pad from a relatively high binary value to a relatively low binary value in response to corresponding changes of said binary input drive signals.

4. The combination according to Clair 3 further including delay means wherein said second NMOS output transistor has a high gate capacitance and wherein said second supply means is connected to the gate of said second output NMOS transistor through said delay means for supplying said relatively low current thereto, causing delayed conductivity of said second NMOS output transistor from its non-conductive state to its fully conductive state.

* * * * *